United States Patent
Balachandran et al.

(10) Patent No.: US 9,641,167 B2
(45) Date of Patent: May 2, 2017

(54) CURRENT MIRROR CIRCUITS WITH NARROW BANDWIDTH BIAS NOISE REDUCTION

(71) Applicant: Robert Bosch GmbH, Stuttgart (DE)

(72) Inventors: Ganesh K. Balachandran, Sunnyvale, CA (US); Vladimir P. Petkov, San Jose, CA (US)

(73) Assignee: Robert Bosch GmbH, Stuttgart (DE)

( * ) Notice: Subject to any disclaimer, the term of this patent is extended or adjusted under 35 U.S.C. 154(b) by 193 days.

(21) Appl. No.: 14/299,426

(22) Filed: Jun. 9, 2014

(65) Prior Publication Data

US 2015/0358016 A1    Dec. 10, 2015

(51) Int. Cl.

| | |
|---|---|
| *G05F 1/10* | (2006.01) |
| *H03K 17/16* | (2006.01) |
| *G05F 3/16* | (2006.01) |
| *G05F 3/26* | (2006.01) |
| *G11C 27/02* | (2006.01) |

(52) U.S. Cl.
CPC .............. *H03K 17/16* (2013.01); *G05F 3/16* (2013.01); *G05F 3/26* (2013.01); *G11C 27/02* (2013.01); *G11C 27/024* (2013.01); *G11C 27/028* (2013.01)

(58) Field of Classification Search
CPC ..................... G05F 1/10; G05F 3/02
See application file for complete search history.

(56) References Cited

U.S. PATENT DOCUMENTS

| | | | | |
|---|---|---|---|---|
| 6,236,252 B1 * | 5/2001 | Genest | .................... | G05F 3/262 327/108 |
| 6,522,117 B1 * | 2/2003 | Young | ..................... | G05F 3/267 323/315 |
| 7,808,307 B2 * | 10/2010 | Sakiyama | ............... | G05F 3/262 327/538 |

(Continued)

FOREIGN PATENT DOCUMENTS

WO    2013011344 A1    1/2013

OTHER PUBLICATIONS

Bakker, A. et al., "A CMOS Chopper Opamp with Integrated Low-Pass Filter", Proceedings of the ProRISC Workshop on Circuits, Systems and Signal Processing, 1997, pp. 25-28 (4 pages).

(Continued)

*Primary Examiner* — Hai L Nguyen
(74) *Attorney, Agent, or Firm* — Maginot Moore & Beck LLP

(57) ABSTRACT

A current mirror circuit includes a first transistor connected to a voltage source, a gate of the first transistor being connected to a drain of the first transistor, a current source connected to the drain and the gate of the first transistor, the current source being configured to generate a predetermined first output current, a sample and hold circuit having an input connected to the gate of the first transistor, a second transistor connected to the voltage source, a gate of the second transistor being connected to an output of the sample and hold circuit, and a controller operatively connected to the sample and hold circuit, the controller being configured to operate the sample and hold circuit at a predetermined sampling frequency to attenuate bias noise from the first transistor in a second output current from the second transistor.

13 Claims, 3 Drawing Sheets

(56) References Cited

U.S. PATENT DOCUMENTS 7,852,168 B1  12/2010  Song et al.
2004/0090281 A1  5/2004  Vilander

OTHER PUBLICATIONS

R.J. van de PLassche, "CMOS Integrated Analog-to-Digital and Digital-to-Analog Converters", Kluwer Academic Publishers, 2003, Chapter 4, pp. 205-235.
C-H. Lin, K. Bult, "A 10-b, 500MSample/s CMOS DAC in 0.6mm2", IEEE Journal of Solid-State Circuits, vol. 33, pp. 1948-58, Dec. 1998, pp. 1948-1958.
A. van den Bosch, M.A.F. Borremans, M.S.J. Steyaert, W. Sansen, "A 12-b, 500Msample/s Current-Steering CMOS D/A Converter", ISSCC Dig. Tech. Papers, Feb. 2001, Abstract, DOI: 10.1109/ISSCC.2001.912676.

* cited by examiner

CURRENT MIRROR CIRCUITS WITH NARROW BANDWIDTH BIAS NOISE REDUCTION

TECHNICAL FIELD

This disclosure relates generally to the field of electronic circuits, and, more particularly, to current mirror circuits.

BACKGROUND

Current mirror circuits are used in a wide range of electronic circuits where a single reference current source is used to control the output of one or more "mirrored" current sources. In one common configuration, a reference or "bias" current source generates an electrical current at a predetermined level. The bias current source is connected to a bias transistor. The bias current source generates a predetermined reference current and the bias transistor also passes the current at the same level as the bias current source, which affects a voltage level at the gate of the bias transistor. The gate of the bias transistor is connected to the gates of one or more additional or "mirrored" transistors that also pass current from an external power supply with reference to the gate voltage from the bias transistor. The mirrored current sources often produce current at output levels that are a multiple of the reference current source. For example, some current mirror configurations generate an output current at the same magnitude as the reference current source (e.g. a multiplier of one). In other embodiments, the mirrored output current is an integer multiple (e.g. a multiplier of 2×, 3×, 4×, etc.) or non-integer multiple (e.g. 0.5×, 1.5×, 2.5×, etc.) of the reference current. A single reference current source can also be mirrored by an array of multiple current outputs that each generate an output current based on the single reference current source.

In some configurations, the output of the current mirror circuit is used in a larger circuit that processes signals at a particular frequency. For example, digital to analog converter (DAC) circuits often receive a digital input signal that is generated at a predetermined frequency and generate analog output signals corresponding to the value of the analog signal. The current mirror circuit in a DAC includes one or more current sources that are selectively activated and summed together to produce an analog output signal with reference to the digital input signal. While DACs are one example of electronic components that employ current mirrors, the current mirror circuits are used in other circuit configurations as well.

One issue with operation of a current mirror is that the output signal includes noise from several different sources. One source of noise in a current mirror comes from a biasing circuit that typically includes a transistor that is operatively connected to the reference current source. A voltage at the gate of a bias transistor is influenced by the flow of current through the reference current source. The gate of the bias transistor is electrically connected to the gates of one or more additional transistors in the current mirror circuit to control the gate voltage levels and corresponding levels of current that flow through the additional transistors.

Prior art solutions to reduce the impact of noise in the output signal include either increasing the magnitude of the reference current through the bias transistor to reduce the relative level of the bias noise compared to the overall level of current or adding a capacitor between the biasing transistor and the transistors that produce the mirrored current to form a filter. However, increasing the current level through the bias transistor also increases the overall power consumption of the current mirror circuit. Additionally, capacitors that are large enough to be effective at filtering noise in many circuits are too large to be incorporated in the current mirror in a practical manner. In many applications, only a comparatively narrow frequency band is of interest to the operation of the circuit that employs the current mirror. For example, in a DAC that is connected to a microelectromechanical system (MEMS) gyroscopic sensor, the frequency of interest corresponds to a narrow range of frequencies around a frequency of oscillation of the sensor. For example, the frequency of oscillation in many MEMS gyroscopes is typically in a range of tens or hundreds of kilohertz, with a frequency band of interest in a range of tens or hundreds of hertz (e.g. an 80 Hz frequency band of interest around a 25 kHz oscillation frequency). Consequently, improvements to current mirror circuits that attenuate noise in a predetermined frequency range without requiring large capacitors for filters would be beneficial.

SUMMARY

In one embodiment, a current mirror circuit that operates with reduced bias noise over narrow bandwidths has been developed. The current mirror circuit includes a first transistor connected to a voltage source, a gate of the first transistor being connected to a drain of the first transistor, a current source connected to the drain and the gate of the first transistor, the current source being configured to generate a predetermined first output current, a sample and hold circuit having an input connected to the gate of the first transistor, a second transistor connected to the voltage source, a gate of the second transistor being connected to an output of the sample and hold circuit, and a controller operatively connected to the sample and hold circuit, the controller being configured to operate the sample and hold circuit at a predetermined sampling frequency to attenuate bias noise from the first transistor in a second output current from the second transistor.

DETAILED DESCRIPTION

For the purposes of promoting an understanding of the principles of the embodiments described herein, reference is made to the drawings and descriptions in the following written specification. No limitation to the scope of the subject matter is intended by the references. The description also includes any alterations and modifications to the illustrated embodiments and includes further applications of the principles of the described embodiments as would normally occur to one skilled in the art to which this document pertains.

Many embodiments of the circuits described below incorporate transistors. As is known to the art, different classes of transistors include complementary metal oxide semiconductor (CMOS) transistors, bipolar transistors, which are also referred to as bipolar junction transistors (BJT), and numerous variations of these transistor types. Most transistors are modeled using three terminals, which are referred to as the "gate", "source", and "drain" in a CMOS transistor and as a "base", "emitter", and "collector" in a bipolar transistor. The pairs of terms "gate" and "base", "source" and "emitter", and "drain" and "collector" refer to analogous terminals in CMOS and BJT transistors, respectively. For purposes of consistency, this document uses the "gate", "source", "drain" nomenclature that is commonly associated with CMOS transistors, but those of ordinary skill in the art should understand that, as used herein, the term "gate" in a CMOS transistor also refers to a "base" in a BJT transistor. Similarly, as used herein, the term "source" also refers to an "emitter" and "drain" also refers to a "collector" in the transistor embodiments that are described below.

Figure 1:
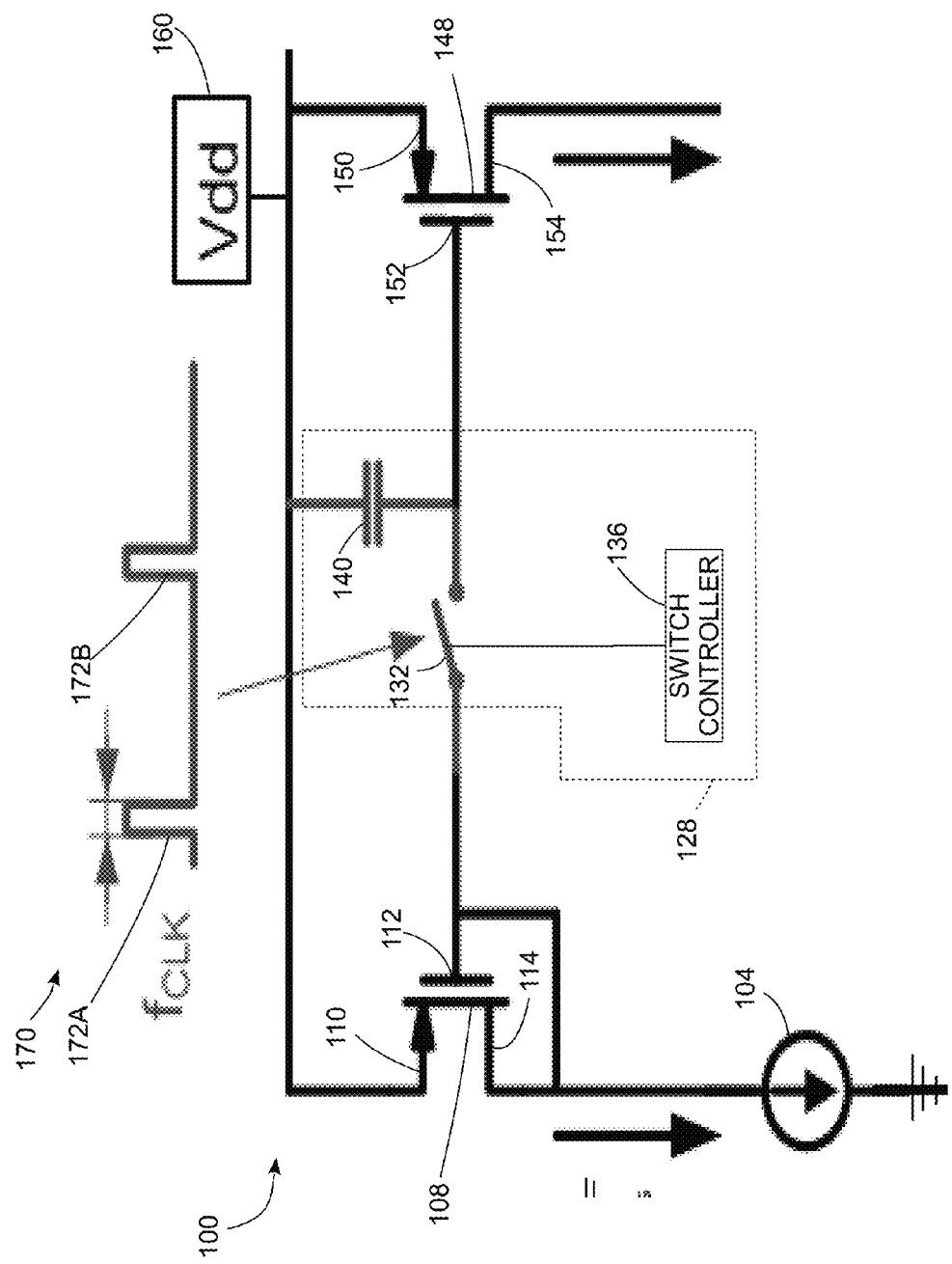
FIG. 1 is a schematic diagram of a current mirror circuit.

FIG. 1 is a schematic diagram of a current mirror circuit 100. The circuit 100 includes a current source 104, a first transistor 108, a sample and hold circuit 128, a second transistor 148, and a voltage supply (VDD, although the term VCC is also used conjunction with bipolar transistors) 160. The first transistor 108 is also referred to as a bias transistor and the second transistor 148 is also referred to as a mirror transistor. The bias transistor 108 includes a source 110, gate 112, and drain 114. The source 110 is connected to an output of VDD 160, the gate terminal 112 is connected directly to the drain terminal 114, and the drain terminal 114 is connected to the current source 104. During operation, the current source 104, which is also referred to as a reference current source, draws a predetermined current through the bias transistor 108. The draw of the current generates a voltage at the gate 112 that operates the transistor 108 with sufficient internal resistance to pass current from the source VDD 160 at the same level as the reference current from the reference current source 104. In the circuit 100, the first transistor 108 and the second transistor 148 are embodied as either CMOS transistors, bipolar transistors, or any other suitable form of transistor that is configured to operate in a current mirror circuit.

The current mirror transistor 148 includes a source 150, gate 152, and drain 154. The source 150 is connected to VDD 160, and the drain 154 is the output of the mirror transistor 154. During operation, the current mirror transistor 148 generates a current that either has the same magnitude as the reference current source 104 or has a level that is a predetermined multiple of the current source 104 (e.g. 0.5×, 2×, 2.5×, 3×, etc.), based on the structure and composition of the mirror transistor 148.

In a traditional current mirror circuit, the gate of the bias transistor is connected directly to the gate of the mirror transistor so that the gates of both transistors have the same voltage level during operation of the current mirror circuit. In the circuit 100, however, the gate 112 of the bias transistor 108 is connected to an input of a sample and hold circuit 128, and an output of the sample and hold circuit 128 is connected to the gate 152 of the mirror transistor 148. The sample and hold circuit 128 includes a switch 132, switch controller 136, and a sample capacitor 140. The sample capacitor 140 is typically much smaller than a capacitor that would be effective for filtering bias noise from the bias transistor 108. Indeed, the sample capacitor 140 remains small by design to enable the sample capacitor 140 to charge quickly to the same voltage level as the bias transistor gate 112 when the switch 132 is closed during a sampling period. The switch 132 is, for example, a solid state transistor or other suitable switching device that is configured to open and close at a predetermined frequency. The switch 132 includes an input terminal that is connected to the gate 112 in the bias transistor 108 and an output terminal that is connected to the sample capacitor 140 and the gates in one or more mirror transistors, such as the gate 152 in the mirror transistor 148. The switch controller 136 is, for example, an oscillator, clock signal generator, or other waveform generator that generates a control signal to open and close the switch 132 at the predetermined frequency.

In FIG. 1, the waveform 170 depicts an illustrative example of an output clock signal from the switch controller 136 at a predetermined frequency $f_{clk}$. The spikes 172A and 172B represent sampling periods during which the switch 132 closes and the capacitor 140 is charged to the same voltage level as the voltage at the gate 112. The switch 132 remains open during the remainder of each clock cycle from the switch controller 136. The spikes 172A and 172B represent a comparatively short duty cycle (e.g. 1% to 10%) for sampling that is sufficiently long to charge the sample capacitor 140 while leaving the bias transistor gate 112 disconnected from the mirror transistor 148 during the most of each sample and hold cycle. During the remainder of each duty cycle, the capacitor 140 retains the voltage level from the bias transistor gate 112 that is produced during the previous sampling period. As is known in the art, the mirror transistor 148 has very high impedance at the gate 152, so when the switch 132 is open the capacitor 140 retains the voltage level that is produced during the sampling period with minimal loss during each clock cycle. Thus, the gate 152 of the mirror transistor 148 receives the same voltage level from the capacitor 140 that is generated during the sampling process from the bias transistor gate 112.

Figure 2:
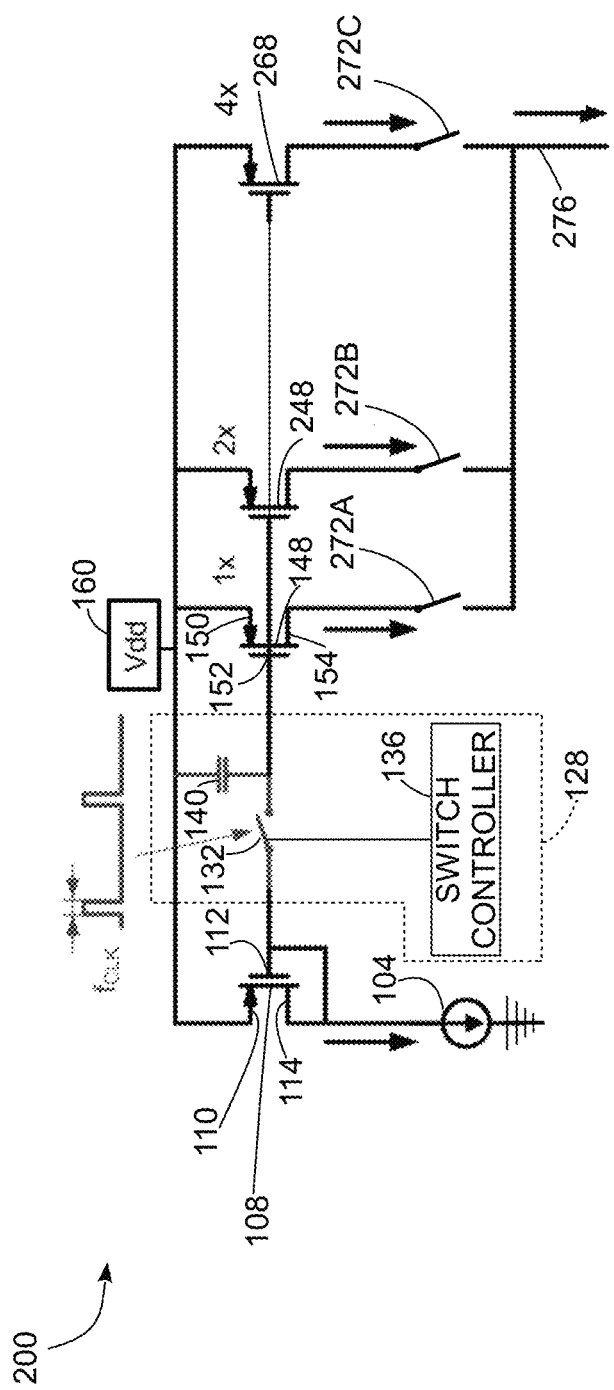
FIG. 2 is a schematic diagram of another current mirror circuit.

FIG. 2 is a schematic diagram of another configuration of a current mirror circuit 200. The circuit 200 includes the current source 104, first transistor 108, sample and hold circuit 128, second transistor 148, and VDD 160 of the circuit 100 in FIG. 1. The circuit 200 also includes a plurality of additional mirror transistors, such as a third transistor 248 and fourth transistor 268, and output switches 272A-272C. The third transistor 248 and fourth transistor 268 are examples of two additional mirror transistors that are both configured in a similar manner to the first mirror transistor 148. Each of the transistors 248 and 268 includes a gate that is connected to the output of the sample and hold circuit 128, a source that is connected to the output of VDD 160, and a drain for an output current that is connected to one of the switches 272B and 272C, respectively. In the current mirror circuit 200, the transistor 148 generates an output current that is substantially equivalent the reference current from the reference current source 104. The transistors 248 and 268 produce power of two multiples of the reference current. For example, the transistor 248 generates an output current that is a multiple of 2× the reference current while the transistor 268 generates an output that is a multiple of 4× ($2^2$). The circuit 200 can include additional current mirror transistors that provide additional multiples of the reference current (e.g. 8×, 16×, 32×, etc.).

The current mirror circuit 200 of FIG. 2 is depicted in a configuration that can be incorporated into a DAC or other circuits that use a summed current output during operation. The drains of the mirror transistors 148, 248, and 268 are connected to switches 272A, 272B, and 272C, respectively. During operation, a decoder (not shown) connects the switches 272A-272C to an output 276 or to electrical ground. The output 276 generates a sum of the currents for any of the transistors 148, 248, and 268 that are connected to the output, such as 1× the reference (transistor 148), 2× the reference current (transistor 248), 4× the reference current (transistor 268), 3× the reference current (transistors 148 and 248), etc. FIG. 2 depicts a single output 276, although alternative embodiments that incorporate differential outputs include a positive output rail and negative output rail where each of the transistors 148, 248, and 268 is connected to one of the positive and negative output rails in different operating configurations.

The current mirror circuits 100 and 200 are depicted using P-type transistors, such as PNP bipolar or pMOS transistors. However, the circuits 100 and 200 are merely illustrative embodiments of one configuration of current mirror circuits. In another configuration, the current mirror circuits 100 and 200 incorporate N-type transistors, such as NPN bipolar or nMOS transistors. In a configuration of the current mirror circuits that use N-type transistors, the source terminals of the bias transistor and the mirror transistors are connected to ground. The voltage source VDD is connected to the bias transistor in series through the reference current source, which is connected to the drain of the bias transistor. In the N-type configuration, the mirrored current flows into the mirror transistors through the drain terminals of the mirror transistors. Aside from these differences, the general configuration and operation of a current mirror circuit that uses N-type transistors is similar to the illustrative embodiments of FIG. 1 and FIG. 2.

Figure 3:
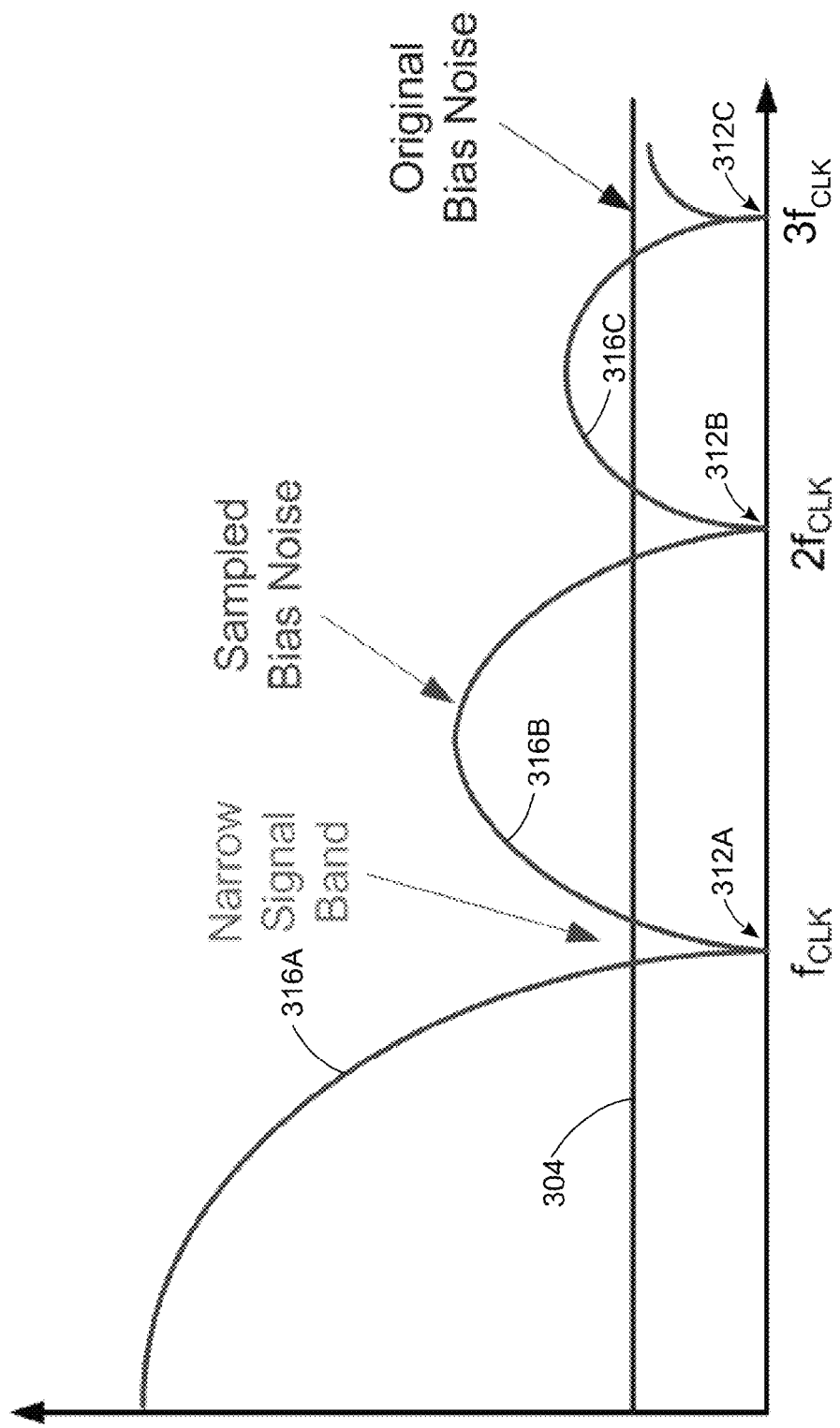
FIG. 3 is a graph that depicts a frequency distribution of bias noise in the current mirror circuits of FIG. 1 and FIG. 2.

In both the circuits 100 and 200, the sample and hold circuit 128 redistributes the bias noise that is inherent to the bias transistor to different frequencies other than the sampling frequency $f_{clk}$. For example, FIG. 3 depicts a graph 300 of bias noise over a range of frequencies. In FIG. 3, the bias noise 304 is modeled as a uniform broad band noise source. The sample and hold circuit 128 operates at the predetermined clock frequency $f_{clk}$, which shifts the bias noise energy away from the clock frequency $f_{clk}$ and one or more harmonics of the clock frequency such as $2f_{clk}$ and $3f_{clk}$. In FIG. 3, the notches 312A, 312B, and 312C are centered on the clock frequency $f_{clk}$ and harmonics $2f_{clk}$ and $3f_{clk}$, respectively. The graph 300 illustrates the first three harmonics for illustrative purposes, but those having skill in the art should recognize that the pattern of attenuation of the bias noise continues for higher frequency harmonics of $f_{clk}$ as well.

The bias noise is still present in the output from the current mirror, but the operation of the sample and hold circuit shifts the distribution of the bias noise. The sample and hold circuit 128 is configured as an ideal sampler followed by a zero-order hold circuit that operates with a transfer function of:

$$\frac{\sin(\pi x)}{\pi x},$$

which is also referred to as a sinc transfer function. The sinc transfer function produces the notches in the frequency response that is depicted in FIG. 3 where the bias noise is attenuated in and around the switching frequency $f_{clk}$ and harmonics of $f_{clk}$ while the bias noise increases at different frequencies. For example, the noise regions 316A, 316B, and 316C include greater levels of bias noise than is present in the original bias noise signal 304. The increase in bias noise levels over frequency ranges that are farther from $f_{clk}$ and harmonics of $f_{clk}$ is due to aliasing in the sample and hold circuit 128 since the sample and hold circuit 128 samples at lower frequencies than much of the bias noise spectrum. However, the frequency band of interest around $f_{clk}$ has a substantially lower level of bias noise, and the increased bias noise at the other frequencies does not negatively affect operation of mirror circuit in a narrow bandwidth around $f_{clk}$.

As described above, the sampling frequency $f_{clk}$ is selected to correspond to a frequency band of interest in a larger circuit that incorporates the current mirror. For example, when incorporated into a DAC that is part of a MEMS gyroscopic sensor that has a predetermined frequency of oscillation of 25 kHz, the sample and hold circuit 128 also operates at the 25 kHz frequency. Consequently, the output from the current mirror in the DAC produces an output current with attenuated bias noise around the predetermined clock frequency.

It will be appreciated that variants of the above-described and other features and functions, or alternatives thereof, may be desirably combined into many other different systems, applications or methods. Various presently unforeseen or unanticipated alternatives, modifications, variations or improvements may be subsequently made by those skilled in the art that are also intended to be encompassed by the following claims.

What is claimed:

1. A current mirror circuit comprising:
   a first transistor connected to a voltage source, a gate of the first transistor being connected to a drain of the first transistor;
   a current source connected to the drain and the gate of the first transistor, the current source being configured to generate a predetermined first output current;
   a sample and hold circuit having an input connected to the gate of the first transistor;
   a second transistor connected to the voltage source, a gate of the second transistor being connected to an output of the sample and hold circuit, a drain of the second transistor being connected to a digital to analog converter (DAC) to provide at least a portion of an output signal for the DAC; and
   a controller operatively connected to the sample and hold circuit, the controller being configured to generate a control signal at a frequency of the output signal that the DAC generates during operation with a duty cycle of not more than 10% to operate the sample and hold circuit to attenuate bias noise from the first transistor at the frequency and increase bias noise for at least one other frequency other than the predetermined frequency in a second output current from the second transistor.

2. The current mirror circuit of claim 1, the second transistor being configured to generate the second output current with a magnitude that is substantially equivalent to a magnitude of the first predetermined output current.

3. The current mirror circuit of claim 1, the second transistor being configured to generate the second output current with a magnitude that is a predetermined multiple of a magnitude of the first predetermined output current.

4. The current mirroring circuit of claim 1 further comprising:
   a third transistor connected to the voltage source, a gate of the third transistor being connected to the output of the sampling circuit.

5. The current mirroring circuit of claim 4, the second transistor being configured to generate the second output current with a magnitude that is substantially equivalent to a magnitude of the first predetermined output current, and the third transistor being configured to generate a third output current with a magnitude that is a predetermined multiple of a magnitude of the first predetermined output current.

6. The current mirroring circuit of claim 4, the second transistor being configured to generate the second output current with a magnitude that is a first predetermined multiple of a magnitude of the first predetermined output current, and the third transistor being configured to generate a third output current with a magnitude that is a second predetermined multiple of a magnitude of the first predetermined output current, the first multiple being different than the second multiple.

7. The current mirroring circuit of claim 1, the sample and hold circuit further comprising:
  a switch having an input terminal and an output terminal, the input terminal being operatively connected to the gate of the first transistor; and
  a capacitor operatively connected to the output terminal of the switch and the voltage source, the output terminal of the switch being connected to the gate of the second transistor.

8. The current mirror circuit of claim 7 wherein the switch is a switch transistor and the switch controller is a clock signal generator that generates a clock signal at the frequency to operate the switch transistor at the frequency.

9. The current mirror circuit of claim 1 wherein the first transistor is a P-type transistor.

10. The current mirror circuit of claim 1 wherein the first transistor is a complementary metal oxide (CMOS) transistor.

11. The current mirror circuit of claim 1 wherein the second transistor is a complementary metal oxide (CMOS) transistor.

12. The current mirror circuit of claim 1 wherein the first transistor is a bipolar junction transistor (BJT).

13. The current mirror circuit of claim 1 wherein the second transistor is a bipolar junction transistor (BJT).

* * * * *